United States Patent [19]
Jayaraman et al.

[11] Patent Number: 5,373,435
[45] Date of Patent: Dec. 13, 1994

[54] HIGH VOLTAGE INTEGRATED CIRCUIT DRIVER FOR HALF-BRIDGE CIRCUIT EMPLOYING A BOOTSTRAP DIODE EMULATOR

[75] Inventors: Rajsekhar Jayaraman, Rancho Palas Verdes, Calif.; Anand Janaswamy, Ossining, N.Y.; Thor Wacyk, Briarcliff Manor, N.Y.

[73] Assignee: Philips Electronics North America Corporation, New York, N.Y.

[21] Appl. No.: 155,053

[22] Filed: Nov. 19, 1993

Related U.S. Application Data

[63] Continuation of Ser. No. 60,176, May 7, 1993, abandoned.

[51] Int. Cl.$^5$ .............................................. H02M 3/24
[52] U.S. Cl. ................................................ 363/98; 363/17
[58] Field of Search ................ 363/17, 56, 98, 132; 307/571, 573, 575, 576, 577, 578

[56] References Cited

U.S. PATENT DOCUMENTS

| | | | |
|---|---|---|---|
| 4,633,381 | 12/1986 | Upadhyay | 363/56 |
| 4,685,040 | 8/1987 | Steigerwald et al. | 363/17 |
| 4,740,717 | 4/1988 | Fletcher et al. | 307/443 |
| 4,796,145 | 1/1989 | Oshikiri | 363/56 |
| 4,908,551 | 3/1990 | Ludikhuize et al. | 315/209 R |
| 4,989,127 | 1/1991 | Wegener | 363/98 |

*Primary Examiner*—Steven L. Stephan
*Assistant Examiner*—Matthew Nguyen
*Attorney, Agent, or Firm*—Laurie E. Gathman; Jack D. Slobod

[57] ABSTRACT

A half-bridge driver circuit including a lower drive module and a floating upper drive module for driving respective external upper and lower power transistors of a high voltage half bridge is contained in an integrated circuit chip which includes an on-chip bootstrap diode emulator for charging an external bootstrap capacitor that powers the upper drive module. The upper drive is accommodated in an insulated well and the diode emulator includes as its main current carrying element, a LDMOS transistor formed along the periphery of the well. The LDMOS transistor is driven into a conducting state at the same time the lower power transistor is driven into a conducting state.

10 Claims, 2 Drawing Sheets

HIGH VOLTAGE INTEGRATED CIRCUIT DRIVER FOR HALF-BRIDGE CIRCUIT EMPLOYING A BOOTSTRAP DIODE EMULATOR

This is a continuation under 37 C.F.R. 1.53 of application Ser. No. 08/060,176, filed May 7, 1993, now abandoned.

BACKGROUND OF THE INVENTION

1. Field of the Invention

The present invention relates to high voltage half-bridge circuits where one end of a load is driven from an output terminal at a junction between lower and upper alternately conducting power transistors that are connected in series across a high voltage DC supply. In its particular aspects, the present invention relates to circuitry for charging a bootstrap capacitor which provides to an upper drive circuit that controls the state of the upper transistor, a bootstrap power supply voltage floating on the voltage at the output terminal.

2. Description of the Related Art

Applications of high voltage half-bridge circuits include electronic ballasts for gas discharge lamps, switched mode power supplies, motor drives, and DC to AC converters.

A half-bridge driver circuit of the type mentioned, most of which is accommodated in a high voltage integrated circuit (HVIC), is known from U.S. Pat. No. 4,989,127, granted Jan. 29, 1991. This patent is assigned to the same assignee as the present application and is herein incorporated by reference. It discloses the general architecture of the driver circuit as including lower and upper drives for controlling the lower and upper power transistors, respectively. The upper drive comprises CMOS circuitry located in a floating well within the HVIC. Adequate breakdown voltage between this floating CMOS circuitry and the balance of the HVIC is achieved because the design of the well periphery is equivalent to that used to form Lateral Diffused Metal Oxide Semiconductor (LDMOS) transistors. The upper drive is powered by a bootstrap capacitor.

European Patent Application 0 318 110, which corresponds to U.S. Pat. No. 4,908,551, discloses a half-bridge circuit, where, as is now conventional, a bootstrap capacitor powering the upper drive is charged via a diode from a low voltage power supply voltage. The latter low voltage is formed across an off-chip high voltage diode.

In present high voltage integrated circuit half-bridge driver circuits of the type considered herein, both the bootstrap capacitor and the diode via which the bootstrap capacitor is charged are discrete components provided off-chip. This is because the presently needed capacitance value of the bootstrap capacitor, in excess of 50 nf, is too large to be feasibly produced on chip, and the breakdown voltage and peak current capacity needed in the bootstrap capacitor charging diode have also heretofore been thought to be beyond what may feasibly be accommodated with reasonable cost of space in the HVIC.

These discrete components are costly and not as reliable as they would be if incorporated in the HVIC.

SUMMARY OF THE INVENTION

It is an object of the present invention to provide a high voltage integrated circuit half-bridge driver circuit which includes on-chip circuitry emulating a diode of adequate breakdown voltage and current capacity via which the bootstrap capacitor is charged.

Briefly, the aforementioned and other objects of the present invention are satisfied by a driver circuit, comprised in a monolithic integrated circuit chip, for driving a half-bridge formed by lower and upper power transistors connected between an output terminal and respective lower and upper rails of a high voltage DC supply, and for charging a bootstrap capacitor, provided off-chip, which powers an on-chip upper drive module that controls the upper power transistor. The bootstrap capacitor has one end connected to the output terminal of the half-bridge. In accordance with the present invention, a bootstrap diode emulator means is provided on-chip for charging the bootstrap capacitor to a bootstrap voltage. The bootstrap diode emulator means comprises a further transistor having a high current first electrode connected to a relatively low voltage power supply output provided on-chip, a high current second electrode adapted to be connected to the other end of the bootstrap capacitor and a control third electrode coupled to a further control signal, derived on-chip from a lower drive command signal, for driving the further transistor to a conducting state when the lower power transistor is driven to a conducting state.

The upper drive module is accommodated in an insulated well formed in the monolithic integrated circuit chip, and the further transistor comprises an elongated LDMOS transistor formed along a portion of the periphery of the well, the first, second and third electrodes of the further transistor respectively being the source, drain and gate electrodes of this LDMOS transistor. Current through the LDMOS transistor flows perpendicular to the periphery of the well, enabling the required current carrying capacity to be obtained by choosing a sufficient length of the LDMOS along the well periphery. The breakdown voltage of the LDMOS transistor is governed by the properties of the insulation of the well periphery because the floating well is formed at its periphery by structure equivalent to that used in forming an LDMOS.

In order to actively place the LDMOS transistor into a conductive state only when the lower power transistor is driven into a conductive state, the further control signal is derived by a buffer fed by the lower drive command signal to produce a buffer output signal having a voltage range between the lower rail and the relatively low supply voltage. Means are provided for translating the voltage range of the buffer output signal to a range of voltage difference between a point coupled to the gate electrode of the LDMOS transistor and its source electrode.

In accordance with another feature of the present invention, which is useful for preventing spurious driving of the LDMOS transistor into a conducting state in response to a voltage spike produced when the lower power transistor turns off, another transistor is provided for clamping the gate electrode to the source electrode of the LDMOS transistor in response to a voltage developed across a resistor in series with the gate electrode which is due to leakage current flowing in a Miller capacitance of the LDMOS transistor coupled between its drain and gate electrodes.

Other objects, features and advantages of the present invention will become apparent upon perusal of the following detailed description when taken in conjunction with the appended drawing, wherein:

DETAILED DESCRIPTION OF THE PREFERRED EMBODIMENTS

Figure 1:
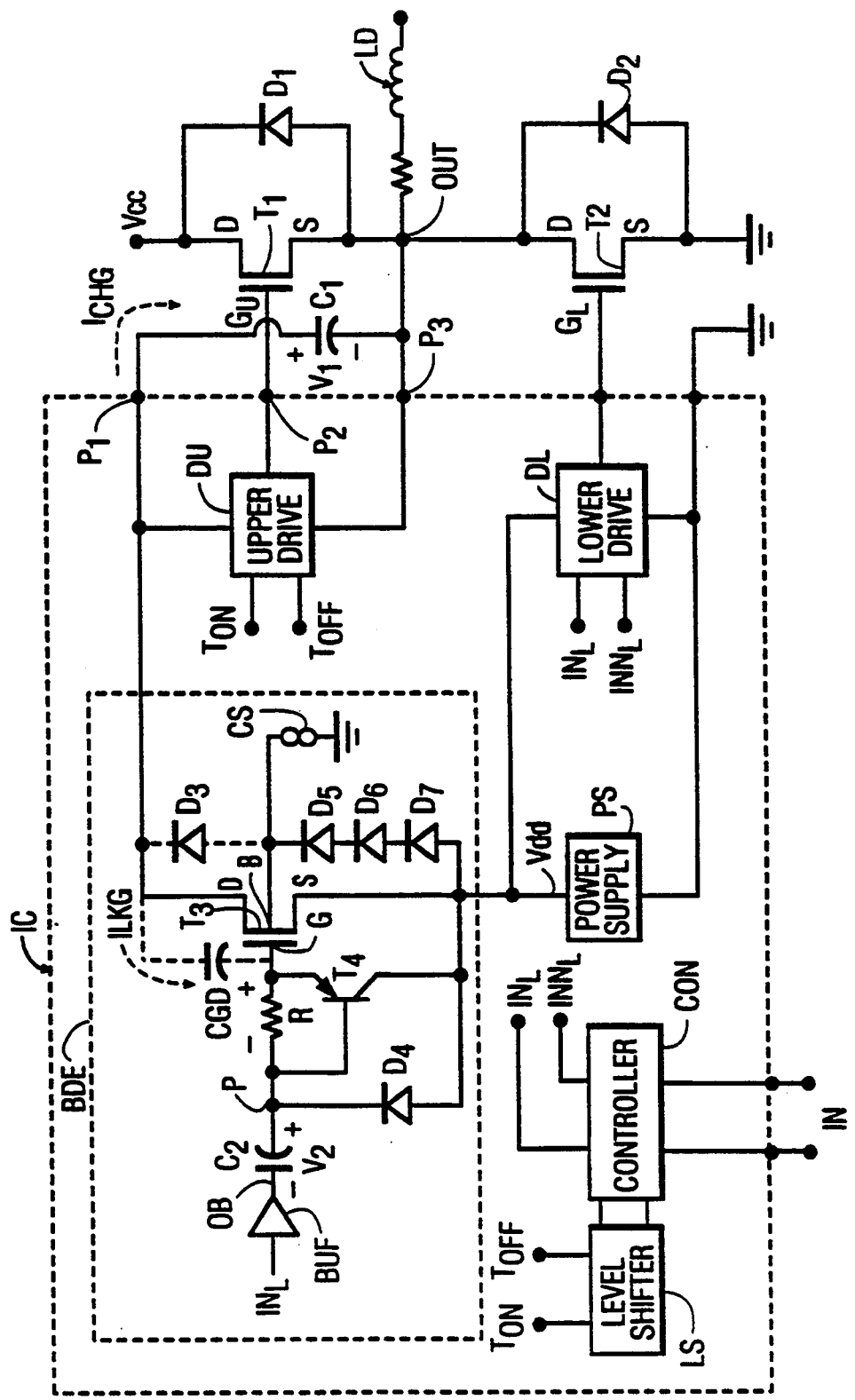
FIG. 1 is a schematic diagram of the driver circuit of the present invention in which components comprised in an integrated circuit chip are enclosed in a dashed box labelled IC.

Referring first to FIG. 1, there is shown a driver circuit in accordance with the present invention, contained in a monolithic high voltage integrated circuit IC, connected for driving an external half-bridge formed by power MOSFET's $T_1$ and $T_2$ connected in series across a high voltage (up to about 500 Volts) DC supply. The general circuit architecture of the half-bridge and driver is the same as shown and described in the aforementioned U.S. Pat. No. 4,989,127, with the exception of the provision of an on-chip bootstrap diode emulator BDE in accordance with the present invention.

In the half-bridge, power transistor $T_1$ is referred to as the upper transistor because its drain electrode is connected to the high side or upper rail of the DC supply, indicated in FIG. 1 as at the potential $V_{cc}$ and power transistor $T_2$ is referred to as the lower transistor because its source electrode is connected to the low side or lower rail of the DC supply, indicated in the figure as at the potential of power ground. The source electrode of upper transistor $T_1$ and the drain electrode of lower transistor $T_2$ are joined at the output terminal OUT of the half-bridge which is also connected to one end of a load LD. In power supply applications such as powering gas discharge lamps, the other end of the load may be maintained at a potential of half the supply voltage by being connected to the midpoint of a capacitive voltage divider (not shown) across the DC supply. As is well known, the transistors $T_1$ and $T_2$ are operated in a switch mode with respect to a high frequency (greater than 20 kHz) repetitive cycle, e.g. on the order of 100 KHz, where each is turned on (i.e. driven into a conducting state) during a different one of two time intervals or phases during a cycle, which are separated from each other by relatively small dead zone intervals on the order of about 500 ns. Because the load LD in many applications has a somewhat inductive impedance, diodes $D_1$ and $D_2$ are the body diodes of $T_1$ and $T_2$, respectively. Diodes $D_1$ and $D_2$ are therefore not explicitly needed. $D_1$ is directed for limiting a positive voltage transient produced at output terminal OUT when the lower power transistor $T_2$ is turned off and diode $D_2$ is directed for limiting a negative voltage transient produced at the output terminal when the upper power transistor $T_1$ is turned off.

These cycles are established by a controller CON, which in response to an external input signal IN produces an essentially binary command signal $IN_L$ and its logical inverse $INN_L$ for controlling the conducting state of lower transistor $T_1$ and via level shifter LS produces pulse command signals $T_{ON}$ and $T_{OFF}$ for controlling the conducting state of the upper transistor $T_2$. Command signal $IN_L$ has one binary state only during the time interval or phase when lower transistor $T_1$ is to be driven into a conducting state. The command signals $T_{ON}$ and $T_{OFF}$ are provided in pulse form for noise and transient immunity purposes; $T_{ON}$ and $T_{OFF}$ indicate the instants when the upper transistor $T_2$ is to be turned on and off, respectively. The lower transistor command signals $IN_L$ and $INN_L$ are fed to a lower drive module DL which in response thereto drives the gate $G_L$ of lower transistor $T_2$ to turn on the lower transistor only during the phase defined by the lower transistor command signals. In a similar manner, command signals $T_{ON}$ and $T_{OFF}$ are fed to an upper drive module DU which in response thereto drives the gate $G_U$ of upper transistor $T_1$ to turn on the upper transistor during the phase defined by the upper transistor command signals. An R/S flip flop (not shown) within the upper drive module DU converts the command signals $T_{ON}$ and $T_{OFF}$ to binary form similar to $IN_L$ and $IN_{LL}$ in order that the balance of the upper drive module may be of the same design as the lower drive module DL.

Lower drive module DL is powered by a relatively low power supply voltage $V_{dd}$, e.g. 12 Volts, and upper drive module is powered by the voltage $V_1$ across an external bootstrap capacitor $C_1$, having a capacitance on the order of 70 nf, which is too large to be produced in integrated circuit IC with reasonable cost of area. One end of bootstrap capacitor $C_1$ is connected to a junction between the point $P_3$ and output terminal OUT. The other end of bootstrap capacitor $C_1$ is coupled to the supply voltage $V_{dd}$ via on-chip bootstrap diode emulator BDE, so that a charging current flows in C1 when the output terminal OUT is maintained substantially at ground potential during the time when lower transistor $T_1$ is in a conducting state, to bring $V_1$ to a voltage of $V_{dd}$ less any small voltage drops across BDE and $T_2$.

Figure 2:
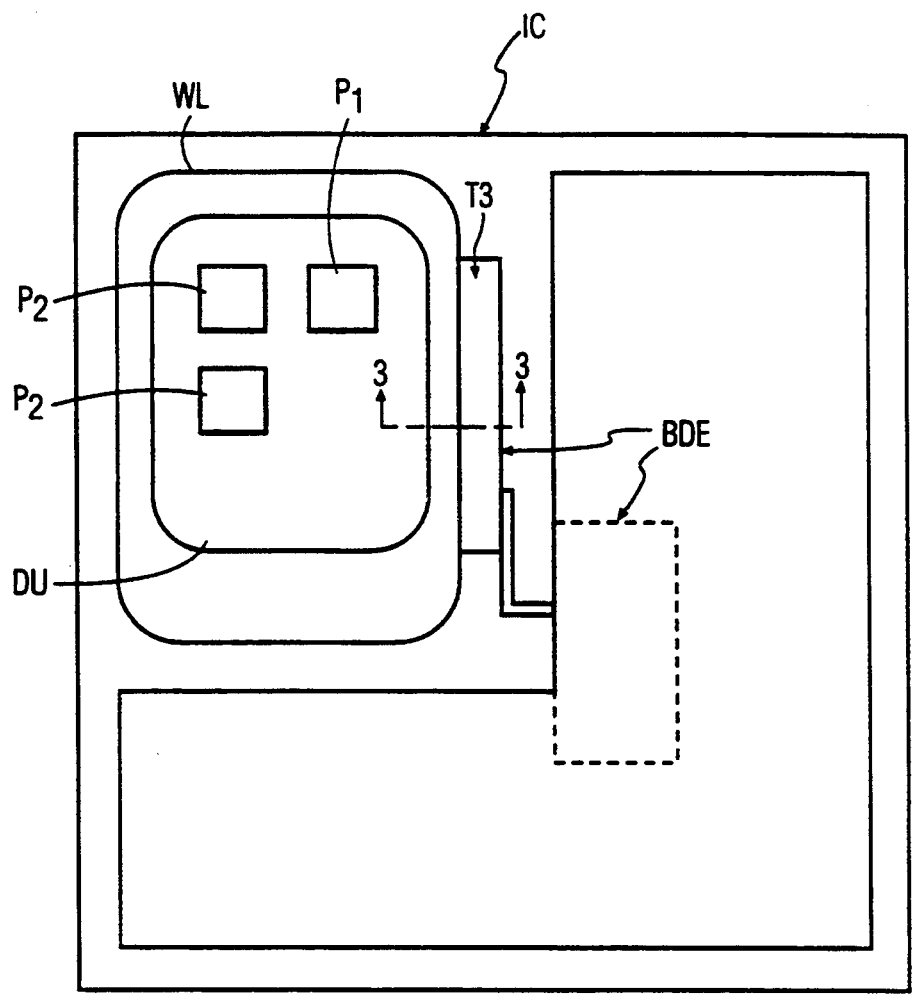
FIG. 2 is a schematic plan view of the integrated circuit chip corresponding to the dashed box IC in FIG. 1, including an elongated area in which a high voltage LDMOS $T_3$ is formed.

Now referring also to FIG. 2, as is known, the upper drive module DU comprises CMOS circuitry formed in an insulated well WL, in integrated circuit chip IC, e.g. an N-well surrounded by P isolation. Thus, well WL is insulated from the balance of the integrated circuit by structure similar to that used to produce a LDMOS transistor. A high voltage diode cannot be integrated in junction isolation technologies because it results in large substrate currents. This could upset the operation of other circuitry. In accordance with the principles of the present invention, a bootstrap diode emulator provided on-chip comprises a LDMOS $T_3$ that is formed along the periphery of the well WL. LDMOS $T_3$ inherently has the same breakdown voltage as the well isolation (in excess of 500 Volts) and because current flows perpendicular to the well periphery, adequate current carrying capacity can be obtained by choice of the extent of the well periphery along which it is formed. Further, the implementation of LDMOS $T_3$ does not require expenditure of additional area; a small amount of additional area on the integrated circuit is however required for the circuitry to drive $T_3$ so that it is in a conducting state only when lower transistor $T_2$ is driven into a conducting state.

As shown in FIG. 1, LDMOS $T_3$ is operated in source follower configuration with its source electrode S connected to $V_{dd}$ and its drain electrode D connected to the higher voltage end of bootstrap capacitor $C_1$. When $T_3$ is turned on, the drain electrode rises to $V_{dd}$. The backgate B of $T_3$ is connected to a point which is three diode drops in voltage below $V_{dd}$. This biasing is produced by the series connected three diodes $D_5$–$D_7$ which are kept in a conducting state by the current sink CS directed between the backgate and ground. A parasitic diode $D_3$ is also produced between the backgate B and the drain electrode, as shown. As a result of the biasing of the backgate, a gate to source voltage of 4 V is required to turn on LDMOS transistor $T_3$.

In order to turn the LDMOS transistor $T_3$ on when the lower power transistor $T_2$ is driven into a conducting state, the lower drive command signal $IN_L$ is applied to a buffer amplifier BUF which produces at its output OB a signal which is at voltage $V_{dd}$ when the lower power transistor $T_2$ is driven into a conducting state and at zero Volts otherwise. This voltage is applied to one end of a second relatively small bootstrap capacitor $C_2$ whose other end, at point P, is coupled to the supply voltage $V_{dd}$ via a diode $D_4$. Bootstrap capacitor $C_2$ has a capacitance of at least five times the gate capacitance of the transistor $T_3$. The buffer BUF has a sufficiently low output impedance that the second bootstrap capacitor $C_2$ is charged via diode $D_4$ to a voltage $V_2$ which equals $V_{dd}$ less one diode drop. This has the effect of translating the range of the voltage at the buffer output OB (greater than one diode drop) to appear directed between point P and the source electrode S of LDMOS transistor $T_3$. Point P is connected to the gate electrode G of transistor $T_3$ via a resistor R of approximately 5 K ohms. This resistor is used to develop a voltage which turns on an PNP transistor $T_4$ whose emitter, base and collector are connected respectively to the gate electrode of $T_3$, point P, and $V_{dd}$. To prevent spurious turning on of the LDMOS transistor $T_3$ due to switching transients at output OUT, the transistor $T_4$ actively pulls the gate of transistor $T_3$ down to $V_{dd}$ in response to a voltage across resistor R due to Miller current through $C_{GD}$. This current, which is caused by a large positive rate of change in voltage when the output voltage at output OUT slews from zero Volts to $V_{cc}$ and the drain electrode of LDMOS transistor $T_3$ slews over a corresponding range, would otherwise charge the gate capacitance to a turn on level. As a result, the bootstrap diode emulator BDE conducts only at the times a bootstrap diode would have conducted to correctly charge the bootstrap capacitor $C_1$.

It should now be apparent that the objects of the present invention have been satisfied in all respects. Further, while the present invention has been described in particular detail, it should also be appreciated that its principles have broad general applicability. Consequently, numerous modifications are possible in the details given within the intended spirit and scope of the invention.

What is claimed is:

1. A circuit for driving a half-bridge formed by lower and upper power transistors connected between an output terminal and respective lower and upper rails of a high voltage DC supply, and for charging a bootstrap capacitor having first and second ends, the first end being connected to said output terminal, said circuit comprising:

controller and level shifter means for generating lower and upper drive command signals for commanding driving said respective lower and upper power transistors to noncontemporaneous conducting states;

power supply means for generating at a power supply output a relatively low control voltage with respect to said lower rail;

a lower drive module connected to the power supply output for being powered by said relatively low control voltage and comprising means for applying a lower drive control signal between a control electrode of the lower power transistor and the lower rail in response to said lower drive command signal;

an upper drive module adapted to be connected to the first end of the bootstrap capacitor for being powered by a bootstrap voltage across said bootstrap capacitor and comprising means for applying an upper transistor control signal between a control electrode of the upper power transistor and the output terminal in response to said upper drive input control signal; and bootstrap diode emulator means for charging said bootstrap capacitor to said bootstrap voltage, said bootstrap diode emulator means comprising a further transistor having a high current first electrode connected to said power supply output, a high current second electrode adapted to be connected to the second end of the bootstrap capacitor and a control third electrode coupled to a further control signal derived from said lower drive command signal for driving said further transistor to a conducting state when the lower power transistor is driven to a conducting state.

2. A circuit as claimed in claim 1, which is comprised in a single monolithic integrated circuit chip.

3. A circuit as claimed in claim 2, wherein said upper drive module is accommodated in an insulated well formed in the monolithic integrated circuit chip, and said further transistor comprises an elongated LDMOS transistor formed along a portion of the periphery of said well, the first, second and third electrodes of said further transistor being the source, drain and gate electrodes of said LDMOS transistor.

4. A circuit as claimed in claim 1, further comprising means for deriving said further control signal from said lower drive command signal, said means for deriving comprising a buffer fed by said lower drive command signal to produce a buffer output signal having a voltage range between said lower rail and said relatively low supply voltage, and means for translating the voltage range of said buffer output signal to a range of voltage difference between a point coupled to said control third electrode and said high current first electrode.

5. A circuit as claimed in claim 2, further comprising means for deriving said further control signal from said lower drive command signal, said means for deriving comprising a buffer fed by said lower drive command signal to produce a buffer output signal having a voltage range between said lower rail and said relatively low supply voltage, and means for translating the voltage range of said buffer output signal to a range of voltage difference between a point coupled to said control third electrode and said high current first electrode.

6. A circuit as claimed in claim 3, further comprising means for deriving said further control signal from said lower drive command signal, said means for deriving comprising a buffer fed by said lower drive command signal to produce a buffer output signal having a voltage range between said lower rail and said relatively low supply voltage, and means for translating the voltage range of said buffer output signal to a range of voltage difference between a point coupled to said control third electrode and said high current first electrode.

7. A circuit as claimed in claim 1, wherein said means for deriving said further control signal from said lower drive command signal further comprises means for clamping said third electrode to said first electrode of said further transistor in response to displacement current flowing in a Miller capacitance of said further transistor coupled between the second and third electrodes.

8. A circuit as claimed in claim 2, wherein said means for deriving said further control signal from said lower drive command signal further comprises means for clamping said third electrode to said first electrode of said further transistor in response to displacement current flowing in a Miller capacitance of said further transistor coupled between the second and third electrodes.

9. A circuit as claimed in claim 3, wherein said means for deriving said further control signal from said lower drive command signal further comprises means for clamping said gate electrode to said source electrode of said LDMOS transistor in response to displacement current flowing in a Miller capacitance of said LDMOS transistor coupled between the drain and gate electrodes.

10. A circuit as claimed in claim 4, wherein said means for deriving said further control signal from said lower drive command signal further comprises means for clamping said gate electrode to said source electrode of said LDMOS transistor in response to displacement current flowing in a Miller capacitance of said LDMOS transistor coupled between the drain and gate electrodes.

* * * * *